United States Patent [19]

Atriss et al.

[11] Patent Number: 5,359,635
[45] Date of Patent: Oct. 25, 1994

[54] PROGRAMMABLE FREQUENCY DIVIDER IN A PHASE LOCK LOOP

[75] Inventors: Ahmad H. Atriss, Chandler; Benjamin C. Peterson, Tempe; Lanny L. Parker, Mesa, all of Ariz.

[73] Assignee: Codex, Corp., Mansfield, Mass.

[21] Appl. No.: 47,524

[22] Filed: Apr. 19, 1993

[51] Int. Cl.$^5$ .............................................. H03K 21/02
[52] U.S. Cl. .................................. 377/39; 377/47; 377/52
[58] Field of Search ........................... 377/39, 47, 52

[56] References Cited

U.S. PATENT DOCUMENTS

| 4,573,017 | 2/1986  | Levine        | 328/155 |
| 4,882,505 | 11/1989 | Furman        | 377/121 |
| 4,937,846 | 6/1990  | Malka et al.  | 377/39  |
| 5,155,748 | 10/1992 | Rabii         | 377/52  |
| 5,221,906 | 6/1993  | Hayashi et al.| 377/39  |

Primary Examiner—John S. Heyman
Attorney, Agent, or Firm—Robert D. Atkins

[57] ABSTRACT

A phase lock loop monitors a first digital signal and generates a second digital signal operating substantially at frequency and in-phase with the first digital signal. A programmable divider latches a program integer for providing a latch integer, compares the latch integer to a constant integer, and generates a flag signal having a first state when the latch integer mismatches the constant integer and a second state when the latch integer matches the constant integer. The latch integer is decremented when the flag signal has the first state. The flag signal is delayed in response to first and second clock signals for providing the second digital signal having a frequency determined by the program integer. The first and second digital signals are applied to a lock detection circuit for providing a lock detection signal.

10 Claims, 5 Drawing Sheets

PROGRAMMABLE FREQUENCY DIVIDER IN A PHASE LOCK LOOP

CROSS REFERENCE TO RELATED PATENT APPLICATIONS

This application is related to copending U.S. patent application No. 07/966,824, entitled "PHASE LOCK DETECTION IN A PHASE LOCK LOOP", filed Oct. 26, 1992, by Lanny L. Parker et al and assigned to the same assignee, Codex, Corp.

BACKGROUND OF THE INVENTION

The present invention relates in general no phase lock loops and, more particularly, to a programmable frequency divider in a phase lock loop for extending the pulse width of control signals to a lock detection circuit.

Phase lock loops (PLLs) are found in a myriad of electronic applications such as modems and clock synchronization circuits for computer systems. A conventional PLL includes a phase detector for monitoring a phase difference between an input signal and an output signal of a voltage controlled oscillator (VCO). The phase detector generates an up control signal and a down control signal for a charge pump to charge and discharge a loop filter at a loop node at the input of the VCO. The loop voltage developed across the loop filter determines the output frequency of the VCO. The up and down control signals driving the charge pump set the proper loop node voltage at the input of the VCO to maintain a predetermined phase relationship between the signals applied to the phase detector.

It is common for the PLL to lose phase lock should the input signal fade or jump to a different frequency of operation. The out-of-lock state can be detected with a lock detection circuit and other system processing suspended until the PLL can re-establish phase lock. One lock detection scheme monitors the up control signal and the down control signal at the output of the phase detector to ascertain the lock status of the PLL. If the up control signal and down control signal are not pulsing, then loop node voltage remains substantially constant and the PLL should be in phase lock. When the up control signal and the down control signal are steadily generating pulses charging or discharging the loop filter to adjust the input voltage of the VCO, the loop must be in motion and thus out of phase lock.

During normal operation, the loop node is continuously subjected to leakage through the charge pump circuit thus requiring occasional pulses to maintain the voltage controlling the VCO. However, these intermittent pulses should not indicate an out-of-lock condition. The conventional lock detection circuit may include a delay circuit comprising a string of serially coupled inverters designed to ignore short intermittent pulses from the phase detector having less than a predetermined pulse width. The up and down control signals must have a pulse width as least as long as the delay circuit to trigger an out-of-lock condition. Unfortunately, the pulse widths of the up and down control signals are subject to temperature and process variation and therefore are not well suited as control parameters for ascertaining phase lock. The pulse widths of the up and down control signals are merely rough indicators having limited accuracy of the true phase relationship between the input signals of the phase detector.

Another known lock detection scheme looks at the phase difference between the input signal and the output signal of the VCO as applied to the phase detector. If the transition of these signals occur outside a timeslot window, the loop is out of phase lock. The timeslot window is typically generated from the VCO output frequency and requires the input signal to have a 50% duty cycle since the lock detector checks both edges of the input signal. Moreover, the timeslot window typically has a period equal to the period of the VCO output frequency. As the VCO output frequency increases past say 200 MHz, the width of the timeslot window may decrease to a point of becoming unusable. It is desirable to eliminate the requirement for an input signal with a 50% duty cycle and to provide a timeslot window having an extendible period independent of the VCO output frequency.

DETAILED DESCRIPTION OF THE PREFERRED EMBODIMENT

Figure 1:
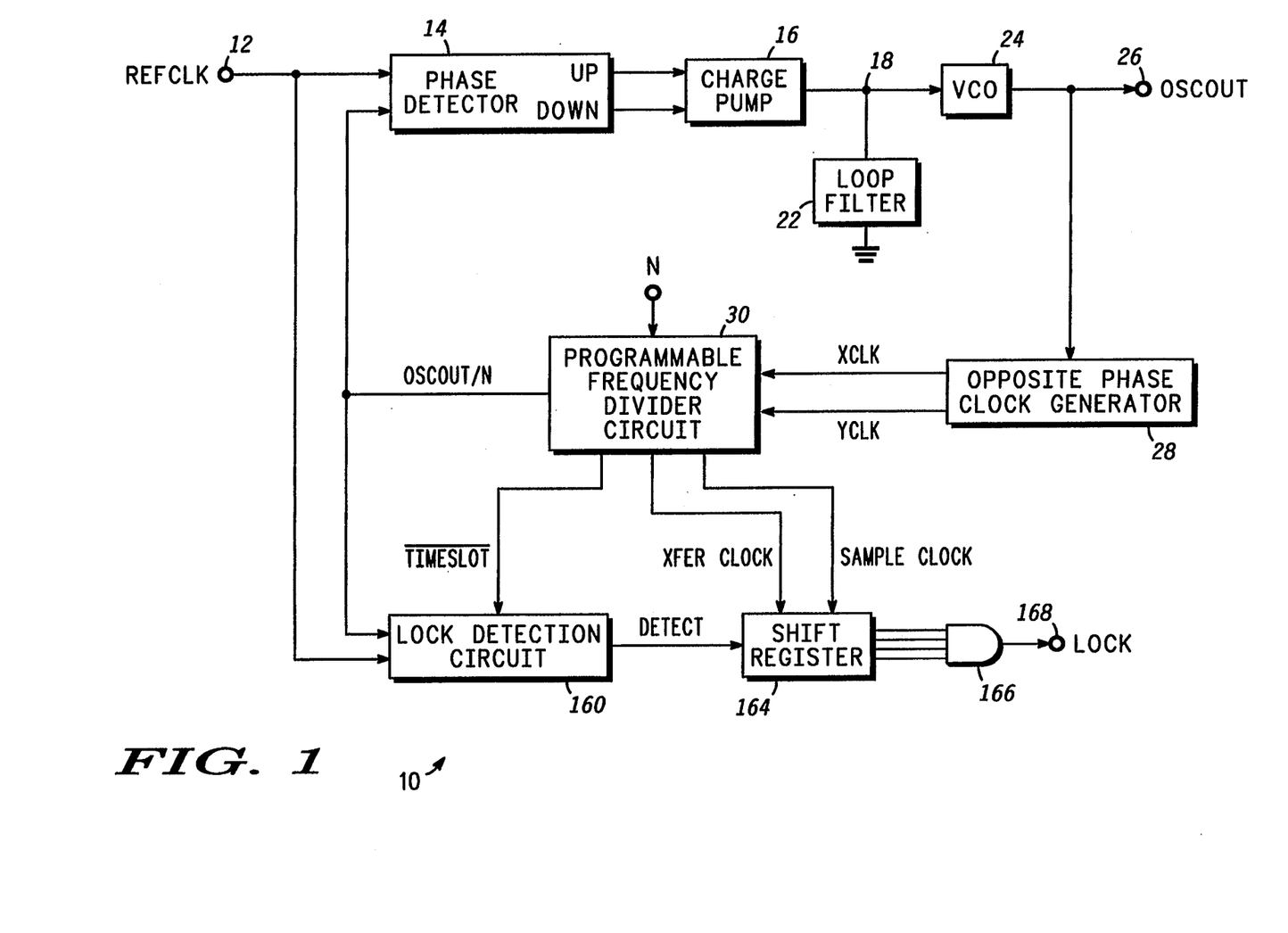
FIG. 1 is a block diagram illustrating a phase lock loop with a programmable divider and lock detection.

A phase lock loop (PLL) 10 is shown in FIG. 1 suitable for manufacturing as an integrated circuit using conventional integrated circuit processes. A REFCLK signal operating at say 2.0 HHz is applied at input 12 at a first input of phase detector 14 to generate an UP control signal and a DOWN control signal for charge pump 16. Charge pump 16 may comprise a P-channel transistor and an N-channel transistor (not shown) serially coupled between a positive power supply conductor and ground potential, wherein the P-channel transistor is responsive to the UP control signal and the N-channel transistor is responsive to the DOWN control signal. The interconnection at the drains of the charge pump transistors drives loop node 18 for charging and discharging loop filter 22 which may comprise a capacitor (not shown) coupled between loop node 18 and ground potential. The voltage at loop node 18 controls VCO 24 for generating an oscillator signal OSCOUT at output 26. The OSCOUT signal of VCO 24 is applied to opposite phase clock generator 28 for developing non-overlapping, opposite phase clocks XCLK and YCLK. The XCLK and YCLK clock signals are divided through programmable frequency divider circuit 30 for providing an OSCOUT/N signal as applied at a second input of phase detector 14. Programmable divider circuit 30 also generates a $\overline{\text{TIMESLOT}}$ signal, a SAMPLE CLOCK signal and an XFER CLOCK signal for the lock detection feature of PLL 10.

The operation of PLL 10 proceeds as follows. The REFCLK signal applied at the first input of phase detector 14 in combination with the OSCOUT/N signal applied at the second input of the same generates an UP control signal, or the DOWN control signal, according to the phase relationship therebetween. The UP control signal pulses if the OSCOUT/N signal lags the REFCLK signal, i.e., frequency of the OSCOUT/N signal is too low relative to the REFCLK signal. Alternately, the DOWN control signal pulses reduce the frequency of the oscillator signal from VCO 24 if the OSCOUT/N signal leads the REFCLK signal. Charge pump 16 is responsive to the UP control signal and the DOWN control signal for charging and discharging loop node 18. The voltage developed at loop node 18 drives VCO 24 to generate up to say 200 MHz for the OSCOUT signal which is frequency divided down by programmable divider circuit 30 for providing the OSCOUT/N signal at the second input of phase detector 14. A control signal N selects the divisor of programmable frequency divider circuit 30. Thus, phase detector 14 monitors the phase difference between the REFCLK signal and the OSCOUT/N signal and generates UP and DOWN control signals as necessary for charge pump 16 to drive loop node 18 and VCO 24 to maintain a predetermined phase relationship between the REFCLK and OSCOUT/N signals.

Figure 2:
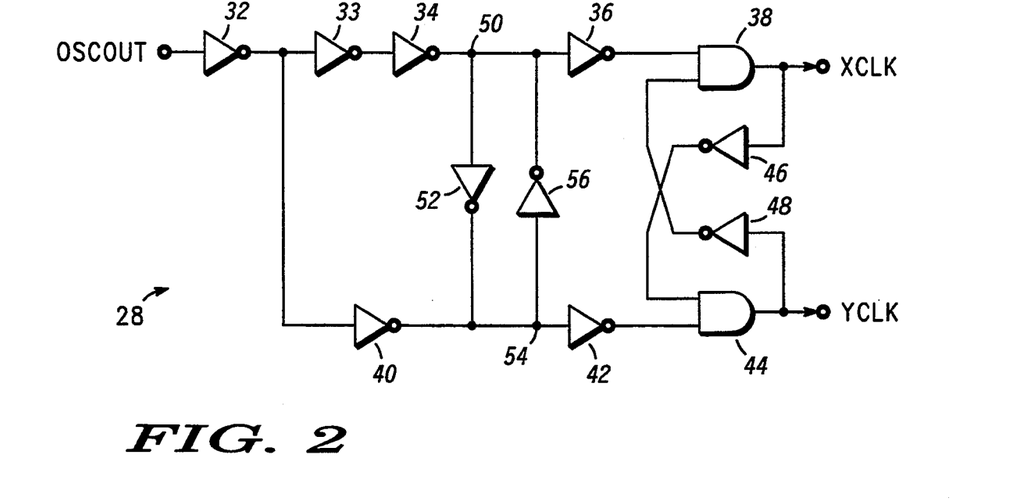
FIG. 2 is a schematic diagram illustrating the opposite phase clock generator of FIG. 1.

Opposite phase clock generator 28 is shown in FIG. 2 where OSCOUT is applied through inverters 32, 33, 34 and 36 to a first input of AND gate 38. The output of inverter 32 is coupled through inverters 40 and 42 to a first input of AND gate 44. The output of AND gate 38 provides the XCLK clock signal as applied through inverter 46 to a second input of AND gate 44 Likewise, the output of AND gate 44 provides the YCLK clock signal as applied through inverter 48 to a second input of AND gate 38. The output of inverter 34 at node 50 is coupled through inverter 52 to the input of inverter 42, while the output of inverter 40 at node 54 is coupled through inverter 56 to the input of inverter 36.

When OSCOUT switches to logic zero, the output of inverter 32 goes to logic one. Inverter 40 attempts to switch node 54 to logic zero before node 50 switches to logic one because node 54 is only two inverter delays away from OSCOUT while node 50 is three inverter delays away. However, the transition of node 54 to logic zero is slowed by inverter 52 because node 50 is still logic zero two inverter delays after OSCOUT changes to logic zero. Inverter 52 acts to hold node 54 at logic one until the output of inverter 34 changes state. A similar scenario follows when OSCOUT switches to logic one. Thus, the transition of inverters 36 and 42 overlap 180° out-of-phase and cross approximately at the 50% mark, thereby overcoming the delay difference imposed by an unequal number of inverters between OSCOUT and nodes 50 and 54.

When the output of inverter 36 is logic zero, the XCLK clock signal at the output of AND gate 38 goes to logic zero. AND gate 44 receives logic ones from the outputs of inverters 42 and 46 for providing a logic one YCLK clock signal. When the output of inverter 42 goes to logic zero, the YCLK clock signal goes to logic zero. AND gate 38 receives logic ones from the output of inverters 36 and 48 for providing a logic one XCLK clock signal. Hence, the XCLK and YCLK clock signals are non-overlapping and opposite phase switching at substantially the 50% mark and operating at the frequency of OSCOUT. OSCOUT and XCLK signals operate in-phase.

Figure 3:
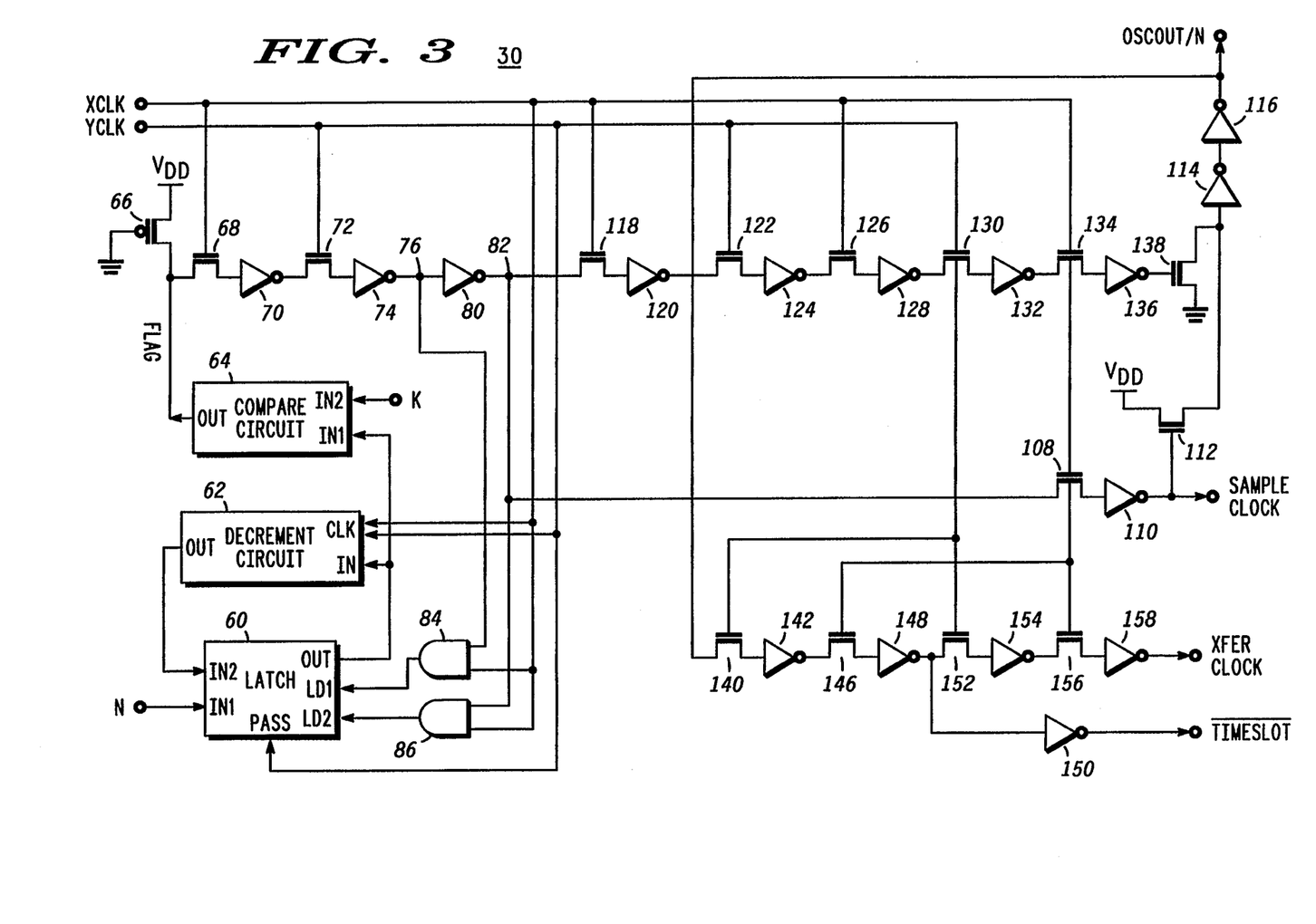
FIG. 3 is a schematic diagram illustrating the programmable divider circuit of FIG. 1.

Further detail of programmable frequency divider circuit 30 is shown in FIG. 3 including latch 60 having first and second inputs IN1 and IN2 receiving the program integer N and an output from decrement circuit 62, respectively. The output of latch 60 is coupled to an input of decrement circuit 62 and the IN1 input of compare circuit 64. The IN2 input of compare circuit 64 receives a constant integer K. Transistor 66 operates as e pull-up device at the output of compare circuit 64. The gate of transistor 66 receives ground potential, while the source of transistor 66 receives power supply potential $V_{DD}$ operating at say 5.0 volts. The output signal from compare circuit 64 passes through transistor 68, inverter 70, transistor 72 and inverter 74 to node 76 in response to the XCLK and YCLK clock signals applied at the gates of transistors 68 and 72, respectively. Inverter 80 has an input coupled to node 76 and an output coupled to node 82. AND gate 84 has one input coupled to node 76 while its second input receives the XCLK clock signal. AND gate 86 has one input coupled to node 82 while its second input receives the XCLK clock signal. The outputs of AND gates 84 and 86 are coupled to the LD1 and LD2 load inputs of latch 60, respectively. The PASS input of latch 60 receives the YCLK clock signal.

Consider a VCO output frequency operating at 200 MHz. If the desired period of $\overline{\text{TIMESLOT}}$ is say 500 ns, then programmable divider circuit 30 may be set to divide the 200 MHz XCLK and YCLK clock signals by say intender one-hundred. Accordingly, program integer N is set equal to ninety-nine (one less than one-hundred), i.e., "1100011". Compare circuit 64 produces a logic one FLAG pulse every one-hundredth OSCOUT clock cycle. The period of the FLAG pulse is the same as the period of OSCOUT. The FLAG pulse is lengthened by a delay circuit (114-138) to achieve the desired pulse width (at least one XCLK clock cycle) for $\overline{\text{TIMESLOT}}$ and XFER CLOCK signals.

Assume FLAG is initially logic one. A logic one XCLK clock signal turns on transistor 68 and passes the logic one to inverter 70. The next logic one YCLK clock signal turns on transistor 72 and passes a logic zero from inverter 70 to inverter 74. Thus, node 76 goes to logic one and node 82 goes to logic zero following one period of the XCLK and YCLK clock signals after FLAG becomes logic one. The LD1 input of latch 60 receives a logic one from AND gate 84 at the following logic one XCLK clock signal to load the program integer N from the IN1 input Latch 60 now contains integer "1100011" and provides the same integer at its OUT output after the next logic one YCLK clock signal. Decrement circuit 62 receives the "1100011" from latch 60 and performs a decrement of one each period of the XCLK and YCLK clock signals.

Figure 4:
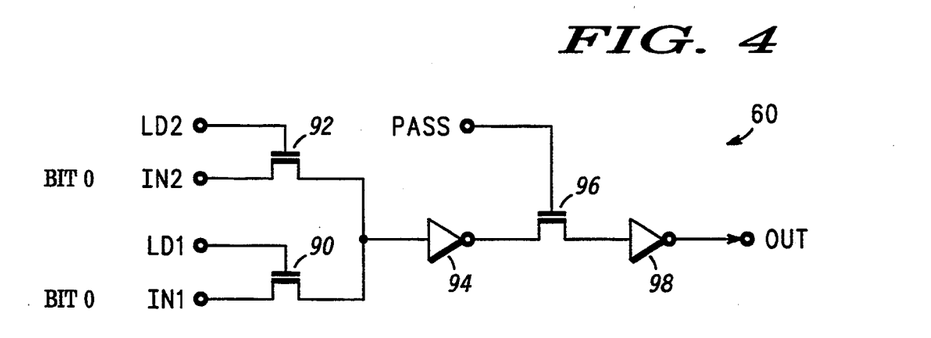
FIG. 4 is a schematic diagram illustrating the latch circuit of FIG. 3.

An embodiment of latch 60 is shown in FIG. 4 where the gates of transistors 90 and 92 receive the LD1 and LD2 inputs respectively. The sources of transistors 90 and 92 are coupled together to the input of inverter 94. Pass transistor 96 is coupled between the output of inverter 94 and the input of inverter 98 and operates in response to the PASS input of latch 60. When the LD1 input is logic one, transistor 90 passes the logic state applied at the IN1 input to inverter 94. A logic one YCLK clock signal enables transistor 96 to pass the inverted logic state from inverter 94 to produce the same logic state at the OUT output of latch 60 as applied at the IN1 input. Alternately, when the LD2 input is logic one, transistor 92 passes the logic state applied at the IN2 input to inverter 94. A logic one YCLK clock signal enables transistor 96 to pass the inverted logic state from inverter 94 to produce the same logic state at the OUT output of latch 60 as applied at the IN2 input.

Latching circuit 90-98 may latch the least significant bit of the applied digital signal. A latching circuit like 90-98 is provided for each bit of the digital signal applied thereto.

Figure 5:
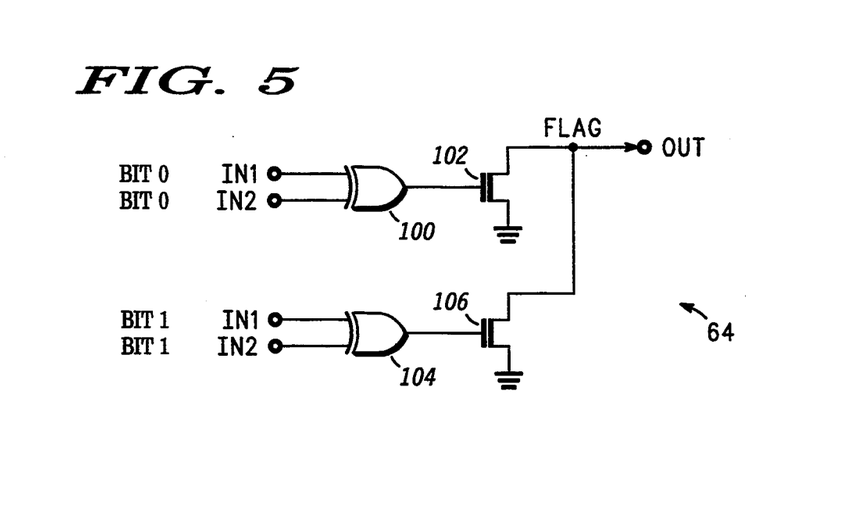
FIG. 5 is a schematic diagram illustrating the compare circuit of FIG. 3.

Compare circuit 64 compares the "1100011" from latch 60 with an integer K="0000001". An embodiment of compare circuit 64 is illustrated in FIG. 5 as exclusive-OR gate 100, transistor 102, exclusive-OR gate 104 and transistor 106. The comparing circuit 100-102 compares the least significant BIT 0 of the applied digital signals, while comparing circuit 104-106 compares the second least significant BIT 1. A comparing circuit like 100-102 is provided for each bit of the digital signals applied at the IN1 and IN2 inputs of compare circuit 64. In the present example, the least significant bits of the integer K="0000001" and the "1100011" from latch 60 match whereby the output of exclusive-OR gate 100 goes to logic zero. Transistor 102 is thereby disabled. The second least significant bits do not match and exclusive-OR gate 104 produces a logic one. Transistor 106 turns on and pulls the OUT output of compare circuit 64 to logic zero. The drains of transistors 102 and 106 are coupled together so that only one mismatch between the output signal of latch 60 and the integer K causes a logic zero FLAG.

Returning to FIG. 3, the logic zero FLAG passes through transistors 68 and 72 and inverters 70 and 74 during the subsequent period of the XCLK and YCLK clock signals. Node 76 goes to logic zero and node 82 goes to logic one. The next logic one XCLK clock signal produces a logic one at the output of AND gate 86 and enables the IN2 input of latch 60. The "1100011" having been decremented by one to "1100010" in decrement circuit 62 during the previous period of the XCLK and YCLK clock signals is loaded into latch 60 and passes to decrement circuit 62 and compare circuit 64. The value "1100010" is again decremented by decrement circuit 62 during the following period of the XCLK and YCLK clock signals. The value "1100010" is compared with integer K="0000001". FLAG remains logic zero since the digital signals still do not match. Nodes 76 and 82 remain at logic zero and logic one, respectively. The process continues until the value in latch 60 has been decremented to "0000001" to match integer K="0000001" at which time compare circuit 64 produces a logic one FLAG pulse having a pulse width equal to OSCOUT.

The logic one FLAG passes through transistors 68 and 72 and inverters 70 and 74 during the following period of the XCLK and YCLK clock signals. Node 76 goes to logic one and node 82 goes to logic zero. The logic zero at node 82 passes through transistor 108 during the second high state of the XCLK clock signal after the FLAG pulse becomes logics one. Inverter 110 complements the signal to produce a logic one SAMPLE CLOCK output signal at the gate of transistor 112. Transistor 112 turns on to pull the input of inverter 114 to logic one as the OSCOUT/N output signal at the output of inverter 116 goes to logic one. The logic one at node 76 enables the LD1 input of latch 60 to reload the program integer N="1100011". The new latch value passes to compare circuit 64 at the next high state of the YCLK clock signal after node 76 goes to logic one. A comparison of the new latch value and the integer K yields a mismatch and the FLAG signal returns to logic zero. Nodes 76 and 82 switch back to logic zero and logic one, respectively, during the following period of the XCLK and YCLK clock signals to repeat the aforedescribed process. Thus, programmable divider circuit 30 produces a logic one FLAG pulse having the same pulse width as OSCOUT once every Nth cycle of OSCOUT.

To lengthen the pulse width of $\overline{\text{TIMESLOT}}$, transistor 118 turns on during the following high state of the XCLK clock signal after node 82 goes to logic zero to pass the logic zero state to inverter 120. Inverter 120 complements the signal and passes it through transistor 122 during the high state of the YCLK clock signal where inverter 124 complements the signal again. The logic zero from integer 124 passes through transistor 126 during another high statue of the XCLK clock signal. Inverter 128 complements the signal and passes it through transistor 130 during another high state of the YCLK clock signal where inverter 132 complements the signal again. The next high state of the XCLK clock signal pass the logic zero from inverter 132 through transistor 134 and produces a logic one at the output of inverter 136. Transistor 138 turns on and pulls the input of inverter 114 to logic zero. By now, node 82 has switched back to logic one and turned off transistor 112. The OSCOUT/N output signal goes to logic zero following inverter 116. Transistors 118, 122, 126, 130 and 134 and inverters 120, 124, 128, 132 and 136 operate as a delay circuit to lengthen the logic zero state of the OSCOUT/N signal. The delay may be adjusted by providing more or less transistor-inverter pairs between node 82 and the gate of transistor 138.

The OSCOUT/N signal also passes through transistor 140 during the high state of the YCLK clock signal where it is complemented by inverter 142. Transistor 146 passes the complemented signal to inverter 148 during the next high state of the XCLK clock signal. The output signal of inverter 148 provides the $\overline{\text{TIMESLOT}}$ output signal after inversion by inverter 150. The output signal of inverter 148 also passes through transistor 152 during another high state of the YCLK clock signal. Inverter 154 complements the signal and passes it though transistor 156 during another high state of the XCLK clock signal. Inverter 158 provides the XFER CLOCK output signal at its output. Transistors 140, 146, 152 and 156 and inverters 142, 148, 150, 154 and 158 operate to center the $\overline{\text{TIMESLOT}}$ about the zero-going (logic one-to-logic zero) transition of OSCOUT/N with the XFER CLOCK signal occurring one XCLK and YCLK clock period later. Transistors 140 and 146 and inverters 142, 148 and 150 operate to widen the $\overline{\text{TIMESLOT}}$ pulse.

Returning to FIG. 1, the REFCLK signal and the OSCOUT/N signal are applied at the first and second inputs of lock detection circuit 160. The $\overline{\text{TIMESLOT}}$ signal from programmable divider circuit 30 is also applied to lock detector circuit 160 for generating a DETECT signal when the REFCLK signal and OSCOUT/N signal are logic one at the time of the zero-going transition of the $\overline{\text{TIMESLOT}}$ signal and logic zero at the time of the positive-going transition of the $\overline{\text{TIMESLOT}}$ window. The $\overline{\text{TIMESLOT}}$ window is defined as the low state of the $\overline{\text{TIMESLOT}}$ signal.

The DETECT signal from lock detection circuit 160 is applied at the data input of 4-bit master/slave shaft register 164 while the SAMPLE CLOCK and XFER CLOCK signals from programmable divider circuit 30 are applied au the clock inputs of the same. The SAMPLE CLOCK latches the input data in a master section of shift register 164 while the XFER CLOCK transfers the data to a slave section. The overall effect is to shift data between adjacent bit locations. Shift register 164 includes a tap point at each bit position coupled to the inputs of AND gate 166 for providing a LOCK signal at output 168. It takes only one false DETECT signal (logic zero) shifting into shift register 164 to drive the LOCK signal low indicating a out-of-lock condition. The DETECT signal must return to the true state (logic one) for at least four SAMPLE CLOCK and XFER CLOCK periods to completely shift the logic zero out of 4-bit shift register 164 and re-establish a true state for the LOCK signal. It is understood that shift register 164 can be made wider, say 12 bits or more, to increase the number of consecutive true DETECT signals necessary to issue a true LOCK signal.

Figure 6:
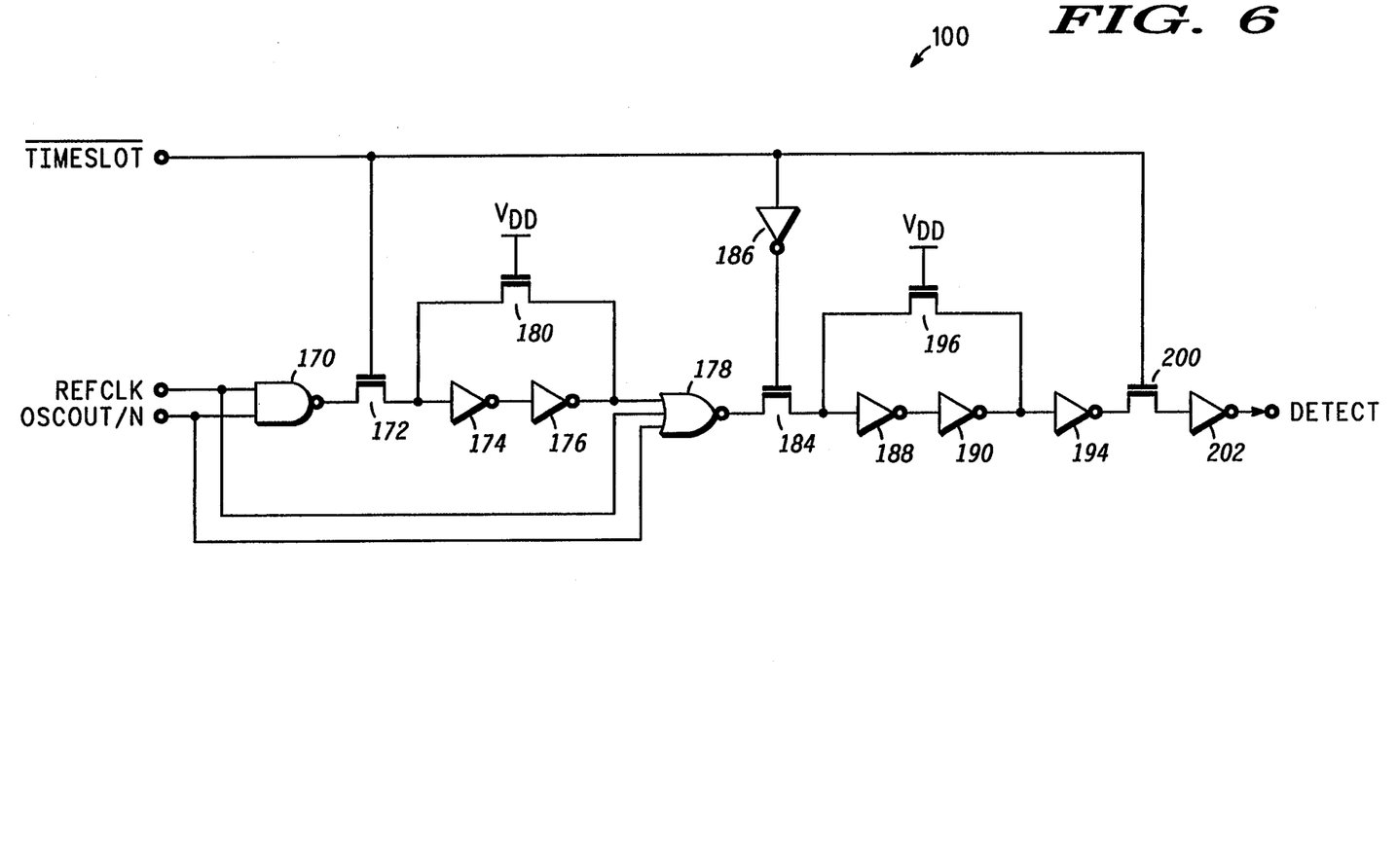
FIG. 6 is a schematic diagram illustrating the lock detection circuit of FIG. 1.

Further detail of lock detector circuit 160 as shown in FIG. 6, wherein the REFCLK signal and the OSCOUT/N signal are applied at first and second inputs of NAND gate 170. The output of NAND gate 170 is coupled to the drain of transistor 172 which includes a gate coupled for receiving the $\overline{\text{TIMESLOT}}$ signal. The source of transistor 172 is coupled through inverters 174 and 176 to a first input of NOR gate 178. The REFCLK signal and the OSCOUT/N signal are applied at second and third inputs of NOR gate 178. Transistor 180 includes a drain coupled to the output of inverter 176, a source coupled to the input of inverter 174 and a gate coupled for receiving positive power supply potential $V_{DD}$ for providing a latching feedback circuit around inverters 174-176. The output of NOR gate 178 is coupled to the drain of transistor 184, while the gate of transistor 184 receives the TIMESLOT signal complemented by inverter 186. The source of transistor 184 is coupled through inverters 188 and 190 to an input of inverter 194. Transistor 196 includes a drain coupled to the output of inverter 190, a source coupled to the input of inverter 188 and a gate coupled for receiving the positive power supply potential $V_{DD}$. The output of inverter 194 is coupled to the drain of transistor 200 which includes a gate coupled for receiving the $\overline{\text{TIMESLOT}}$ signal and a source coupled to the input of inverter 202. The output of inverter 202 provides the DETECT signal.

Figure 7:
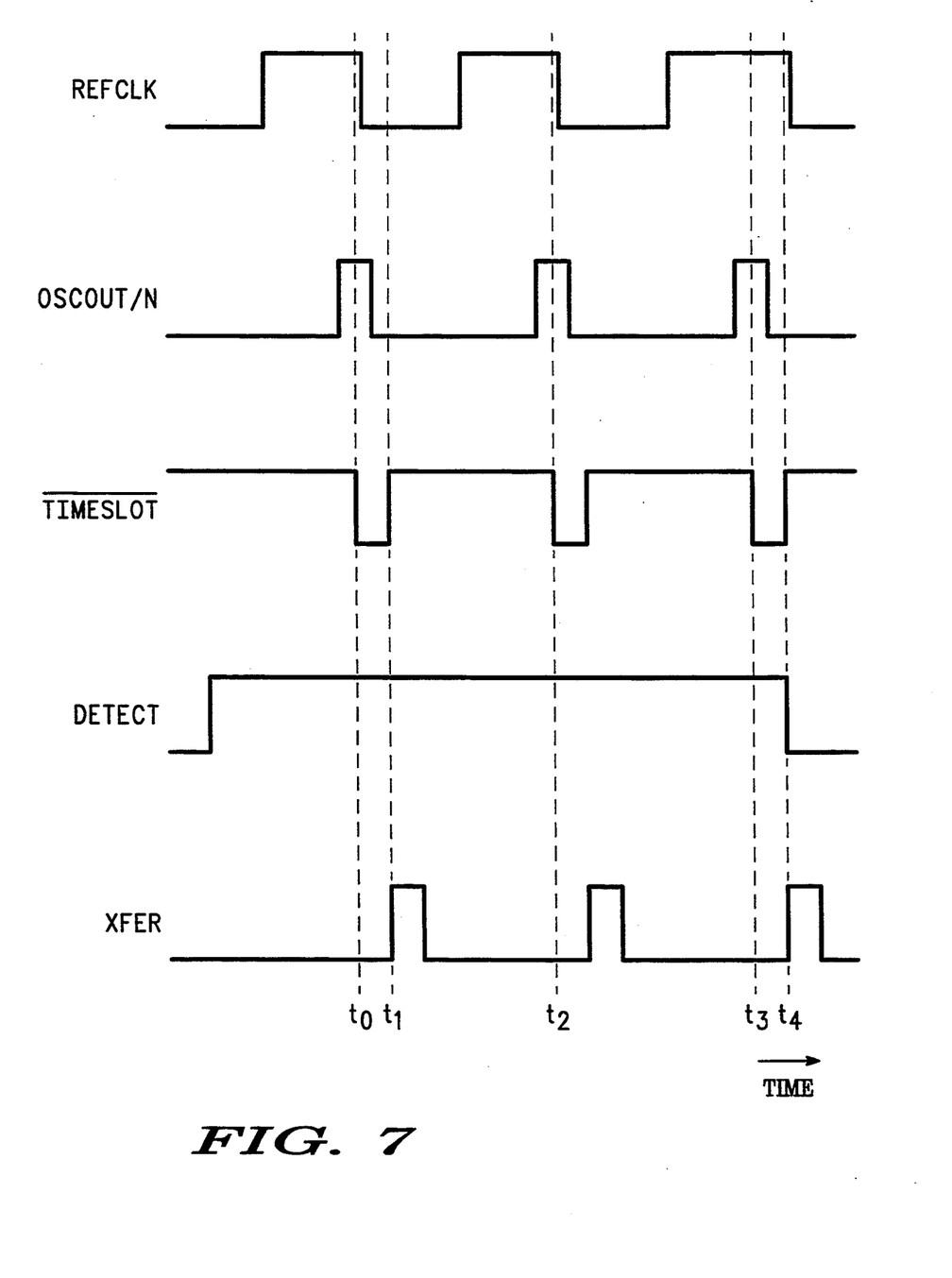
FIG. 7 is a waveform plot illustrating monitoring of phase lock.

The operation of lock detection circuit 100 may best be understood with the waveform plot of FIG. 7 which illustrate a phase lock condition and a detection of an out-of-lock condition. During normal operation just prior to time $t_0$ of FIG. 7, the OSCOUT/N signal and the REFCLK signal are both logic one producing a logic zero at the output of NAND gate 170 and a logic zero at the output of NOR gate 178. The $\overline{\text{TIMESLOT}}$ signal of FIG. 7 is high before time $t_0$ turning on transistor 172 and passing the logic zero to the first input of NOR gate 178. Transistor 180 latches the logic zero back to the input of inverter 174.

When the TIMESLOT signal goes to logic zero, transistor 172 turns off and transistor 184 turns on by inverter 186. The zero-going transition of the $\overline{\text{TIMES LOT}}$ signal samples the logic state of the REFCLK signal and the OSCOUT/N signal. If both are logic one, the output NAND gate 170 is logic zero. Otherwise, the output of NAND gate 170 is logic one. The REFCLK signal and the OSCOUT/N signal both transition to logic zero between times $t_0$ and $t_1$ of FIG. 7 producing a logic one at the output of NOR gate 178 which passes through transistor 184 and inverters 188 and 190. Inverter 194 provides a logic zero at its output. Transistor 196 latches the logic one at the input of inverter 188. As the $\overline{\text{TIMESLOT}}$ signal returns to logic one after time $t_1$, transistor 200 conducts the logic zero from inverter 194 to inverter 202 and provides a logic one DETECT signal. The positive-going transition of the $\overline{\text{TIMESLOT}}$ signal again samples the logic state of the REFCLK signal and the OSCOUT/N signal. If both are logic zero and the output of inverter 176 is logic zero, the output of NOR gate 178 is logic one. Otherwise, the output of NOR gate 178 is logic zero. As long as the REFCLK signal and OSCOUT/N signal are logic one at the time of the zero-going transition of the $\overline{\text{TIMESLOT}}$ signal and logic zero at the time of the positive-going transition of the $\overline{\text{TIMESLOT}}$ signal, the DETECT signal remains at logic one indicating a lock condition for PLL 10.

Now assume the REFCLK signal changes frequency after time $t_2$ such that PLL 10 is no longer in phase lock. Just prior to time $t_3$ of FIG. 7, the OSCOUT/N signal and the REFCLK signal are both logic one producing a logic zero at the output of NAND gate 170 and a logic zero at the output of NOR gate 178. The $\overline{\text{TIMESLOT}}$ signal is high before time $t_3$ turning on transistor 172 and passing the logic zero to the first input of NOR gate 178. Transistor 180 latches the logic zero at the input of inverter 174.

When the $\overline{\text{TIMESLOT}}$ signal goes to logic zero, transistor 172 turns off and transistor 184 turns on by inverter 186, thereby sampling the logic state of the REFCLK signal and the OSCOUT/N signal. The OSCOUT/N signal transitions to logic zero between times $t_3$ and $t_4$; however, REFCLK signal remains at logic one. The logic zero output of NOR gate 178 passes through transistor 184 and inverters 188 and 190. Transistor 196 latches the logic zero at the input of inverter 188. As the $\overline{\text{TIMESLOT}}$ signal returns to logic one after time $t_4$, transistor 200 conducts the logic one from inverter 194 to inverter 202 and provides a logic zero DETECT signal indicating a loss of phase lock for PLL 10. The positive-going sample detects the REFCLK signal out-of-phase with the OSCOUT/N signal. The logic zero DETECT signal shifts into shift register 164 of FIG. 1 at the next SAMPLE CLOCK signal which drives the LOCK signal at output terminal 168 to a logic zero false state. Thus, the lock detection feature of PLL 10 detects a change of frequency of the REFCLK signal and produces a false LOCK signal.

A similar "no phase lock" result follows if the REFCLK signal switches to logic zero before the zero-going $\overline{\text{TIMESLOT}}$ sampling. The output of HAND gate 170 at logic one latches at the output of inverter 176 as the $\overline{\text{TIMESLOT}}$ signal switches to logic zero. NOR gate 178 continues to provide a logic zero throughout the $\overline{\text{TIMESLOT}}$ signal and the DETECT signal goes to logic zero thereby indicating an out-of-lock condition.

In summary, the REFCLK and OSCOUT/N signals must both be logic one so that the output of NAND gate 178 is logic zero before the zero-going transition of the $\overline{\text{TIMESLOT}}$ signal. Furthermore, the REFCLK and OSCOUT/N signals must both be logic zero so that the output of NOR gate 118 is logic one by the time of the positive-going transition of the $\overline{\text{TIMESLOT}}$ signal to indicate a phase locked condition for PLL 10.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A programmable frequency divider, comprising:
   a latching circuit having first and second inputs and an output, said first input receiving a program integer, said output providing a latch integer;
   a decrement circuit having an input and an output, said input being coupled to said output of said latching circuit, said output being coupled to said second input of said latching circuit;
   a compare circuit having first and second inputs and an output, said first input receiving said latch integer, said second input receiving a constant integer; and
   a delay circuit having an input coupled to said output of said compare circuit and operating in response to first and second clock signals for providing a first output signal.

2. A programmable frequency divider, comprising:
   a latching circuit having first and second inputs and an output, said first input receiving a program integer, said output providing a latch integer;
   a decrement circuit having an input and an output, said input being coupled to said output of said latching circuit, said output being coupled to said second input of said latching circuit;
   a compare circuit having first and second inputs and an output, said first input receiving said latch integer, said second input receiving a constant integer; and
   a delay circuit having an input coupled to said output of said compare circuit and operating in response to first and second clock signals for providing a first output signal, said delay circuit including,
   (a) a first transistor having a gate, a drain and a source, said source receiving a first power supply potential, said gate receiving a second power supply potential, said drain being coupled to said output of said compare circuit,
   (b) a second transistor having a gate, a drain and a source, said drain being coupled to said output of said compare circuit, said gate receiving said first clock signal,
   (c) a first inverter having an input and an output, said input being coupled to said source of said second transistor,
   (d) a third transistor having a gate, a drain and a source, said drain being coupled to said output of said first inverter, said gate receiving said second clock signal, and
   (e) a second inverter having an input and an output, said input being coupled to said source of said third transistor, said output being coupled to a first node.

3. The programmable frequency divider of claim 2 wherein said delay circuit further includes:
   a third inverter having an input and an output, said input being coupled to said first node;
   a fourth transistor having a gate, a drain and a source, said drain being coupled to said output of said third inverter at a second node, said gate receiving said first clock signal; and
   a fourth inverter having an input and an output, said input being coupled to said source of said fourth transistor, said output providing a second output signal.

4. The programmable frequency divider of claim 3 further comprising:
   a first AND gate having first and second inputs and an output, said first input being coupled to said first node, said second input receiving said first clock signal, said output being coupled to a first load input of said latching circuit; and
   a second AND gate having first and second inputs and an output, said first input being coupled to said second node, said second input receiving said first clock signal, said output being coupled to a second load input of said latching circuit.

5. The programmable frequency divider of claim 4 wherein said delay circuit further includes:
   a fifth transistor having a gate, a drain and a source, said drain being coupled to said second node, said gate receiving said first clock signal;
   a fifth inverter having an input and an output, said input being coupled to said source of said fifth transistor;
   a sixth transistor having a gate, a drain and a source, said drain being coupled to said output of said fifth inverter, said gate receiving said second clock signal;
   a sixth inverter having an input and an output, said input being coupled to said source of said sixth transistor;
   a seventh transistor having a gate, a drain and a source, said drain being coupled to said output of said sixth inverter, said gate receiving said first clock signal;
   a seventh inverter having an input and an output, said input being coupled to said source of said seventh transistor;
   an eighth transistor having a gate, a drain and a source, said drain being coupled to said output of said seventh inverter, said gate receiving said second clock signal;
   an eighth inverter having an input and an output, said input being coupled to said source of said eighth transistor;
   a ninth transistor having a gate, a drain and a source, said drain being coupled to said output of said eighth inverter, said gate receiving said first clock signal; and
   a ninth inverter having an input and an output of said input being coupled to said source of said ninth transistor.

6. The programmable frequency divider of claim 5 wherein said delay circuit further includes:
   a tenth transistor having a gate, a drain and a source, said gate being coupled to said output of said ninth inverter, said source receiving said second power supply potential;
   a tenth inverter having an input and an output, said input being coupled to said drain of said tenth transistor;
   an eleventh inverter having an input and an output, said input being coupled to said output of said tenth inverter, said output providing said first output signal; and
   an eleventh transistor having a gate, a drain and a source, said drain being coupled to said first power supply potential, said gate being coupled to said output of said fourth inverter, said source being coupled to said input of said tenth inverter.

7. The programmable frequency divider of claim 6 wherein said delay circuit further includes:

a twelfth transistor having a gate, a drain and a source, said drain being coupled to said output of said eleventh inverter, said gate receiving said second clock signal;

a thirteenth inverter having an input and an output, said input being coupled to said source of said twelfth transistor;

a thirteenth transistor having a gate, a drain and a source, said drain being coupled to said output of said thirteenth inverter, said gate receiving said first clock signal;

a fourteenth inverter having an input and an output, said input being coupled to said source of said thirteenth transistor;

a fourteenth transistor having a gate, a drain and a source, said drain being coupled to said output of said fourteenth inverter, said gate receiving said second clock signal;

a fifteenth inverter having an input and an output, said input being coupled to said source of said fourteenth transistor;

a fifteenth transistor having a gate, a drain and a source, said drain being coupled to said output of said fifteenth inverter, said gate receiving said first clock signal;

a sixteenth inverter having an input and an output, said input being coupled to said source of said fifteenth transistor, said output providing a third output signal; and a seventeenth inverter having an input and an output, said input being coupled to said output of said fourteenth inverter, said output providing a fourth output signal.

8. The programmable frequency divider of claim 1 wherein said latch circuit includes:

a first transistor having a gate, a drain and a source, said drain being coupled to said first input of said latching circuit, said gate being coupled to said first load input of said latching circuit;

a second transistor having a gate, a drain and a source, said drain being coupled to said second input of said latching circuit, said gate being coupled to said second load input of said latching circuit;

a first inverter having an input and an output, said input being coupled to said sources of said first and second transistors;

a third transistor having a gate, a drain and a source, said drain being coupled to said output of said first inverter, said gate receiving said second clock signal; and a second inverter having an input and an output, said input being coupled to said source of said third transistor, said output being coupled to said output of said latching circuit.

9. The programmable frequency divider of claim 1 wherein said compare circuit includes:

a first exclusive-or gate having first and second inputs and an output, said first input receiving a first bit of said latch integer, said second input receiving a first bit of said constant integer;

a second exclusive-or gate having first and second inputs and an output, said first input receiving a second bit of said latch integer, said second input receiving a second bit of said constant integer;

a first transistor having a gate, a drain and a source, said gate being coupled to said output of said first exclusive-or gate, said gate receiving a first power supply potential, said drain being coupled to said output of said compare circuit; and a second transistor having a gate, a drain and a source, said gate being coupled to said output of said second exclusive-or gate, said gate receiving said first power supply potential, said drain being coupled to said output of said compare circuit.

10. A method of dividing the frequency of an oscillator signal, comprising the steps of:

latching a program integer for providing a latch integer;

comparing said latch integer to a constant integer and generating a flag signal having a first state when said latch integer mismatches said constant integer and a second state when said latch integer matches said constant integer;

decrementing said latch integer when said flag signal has said first state; and delaying said flag signal in response to first and second clock signals for providing a second oscillator signal having a frequency determined by said program integer.

* * * * *

UNITED STATES PATENT AND TRADEMARK OFFICE
CERTIFICATE OF CORRECTION

PATENT NO. : 5,359,635
DATED : October 25, 1994
INVENTOR(S) : Ahmad H. Atriss, Benjamin C. Peterson, and Lanny L. Parker It is certified that error appears in the above-indentified patent and that said Letters Patent is hereby corrected as shown below:

In column 10, line 46, claim 5, delete "output of" and insert therefor --output,--.

Signed and Sealed this

Twenty-first Day of February, 1995

Attest:

BRUCE LEHMAN

Attesting Officer

Commissioner of Patents and Trademarks